United States Patent [19]

Huang et al.

[11] Patent Number: 4,458,215

[45] Date of Patent: Jul. 3, 1984

[54] MONOLITHIC VOLTAGE CONTROLLED OSCILLATOR

[75] Inventors: Ho-Chung Huang, Princeton Junction; Daniel D. Mawhinney, Livingston, both of N.J.

[73] Assignee: RCA Corporation, New York, N.Y.

[21] Appl. No.: 293,153

[22] Filed: Aug. 17, 1981

[51] Int. Cl.³ .................. H01L 27/04; H03B 5/00
[52] U.S. Cl. ........................... 331/117 D; 331/177 V; 357/14; 357/22; 357/41; 357/51
[58] Field of Search ........ 331/108 C, 108 D, 117 FE, 331/117 V; 357/15, 22, 14

[56] References Cited

U.S. PATENT DOCUMENTS

| | | | |
|---|---|---|---|
| 3,544,862 | 12/1970 | Gallagher et al. | 357/14 |
| 3,675,161 | 7/1972 | Teramoto et al. | 332/16 R |
| 3,749,987 | 7/1973 | Anantha | 357/41 |
| 3,947,761 | 3/1976 | Arai | 357/14 |
| 4,135,168 | 1/1979 | Wade | 357/15 |
| 4,150,344 | 4/1979 | Fenk | 331/108 C |
| 4,189,688 | 2/1980 | Sechi et al. | 331/177 V |
| 4,216,451 | 8/1980 | Nishimura et al. | 334/15 |
| 4,355,374 | 10/1982 | Sakai et al. | 357/14 |

FOREIGN PATENT DOCUMENTS 2842646 4/1980 Fed. Rep. of Germany ...... 331/117 FE

OTHER PUBLICATIONS

Scott et al., "Octave Band Varactor-Tuned GaAs FET Oscillators", IEEE Solid-State Circuits Conference, Feb. 1981, pp. 138–139.
Wade, "X-Band Reverse Channel GaAs FET Power VCO", Microwave Journal, vol. 21, Apr. 1978, p. 92.
Rauscher, "Broadband Varactor-Tuned GaAs FET Oscillator", Electronics Letters, vol. 16, No. 14, Jul. 1980, pp. 534–535.
Kannam et al., "Design Considerations of Hyperabrupt Varactor Diodes", IEEE Transactions on Electron Devices, vol. ED-18, No. 2, Feb. 1971, pp. 109–115.
"Large-Signal Technique for Designing Single-Frequency and Voltage-Controlled GaAs FET Oscillators," C. Rauscher, IEE. Trans. on Microwave Theory & Techniques, vol. MTT-29, No. 4, Apr. 1981, pp. 293–304.

*Primary Examiner*—John S. Heyman
*Assistant Examiner*—Timothy P. Callahan
*Attorney, Agent, or Firm*—Birgit E. Morris; Donald S. Cohen; Kenneth R. Glick

[57] ABSTRACT

A monolithic voltage controlled oscillator is fabricated on a single semiconductor body. The oscillator includes an FET and a varactor diode interconnected such that a voltage applied across the varactor modulates the oscillating frequency of the FET output.

9 Claims, 4 Drawing Figures

MONOLITHIC VOLTAGE CONTROLLED OSCILLATOR

BACKGROUND OF THE INVENTION

The present invention relates to a voltage controlled oscillator (VCO) incorporated entirely on a single semiconductor chip.

Voltage controlled oscillators generally incorporate two major components, an oscillating device, and a means for tuning the frequency of the oscillating device when an applied voltage is varied. These two major components and other related components are typically individual parts, although they might be interconnected to form a relatively compact package. For example, the oscillating device can be an FET which produces an effective negative resistance at radio or microwave frequencies, and the tuning device can be a varactor diode which changes capacitance as a function of a voltage applied thereto.

Problems are encountered, however, when conventional VCOs are operated at high frequencies, such as in the radio or microwave range. At high frequencies, the interconnections between the VCO components create parasitic reactances which are detrimental to VCO performance. If the number and size of interconnections between components could be reduced it is expected that superior bandwidth, output power, operating frequency, and efficiency could be achieved.

SUMMARY OF THE INVENTION

A monolithic voltage controlled oscillator, incorporating an FET and a varactor diode, is fabricated in a semiconductor body. The FET and varactor are interconnected such that a voltage applied across the varactor modulates the oscillating frequency of the FET output.

DETAILED DESCRIPTION

Figure 1:
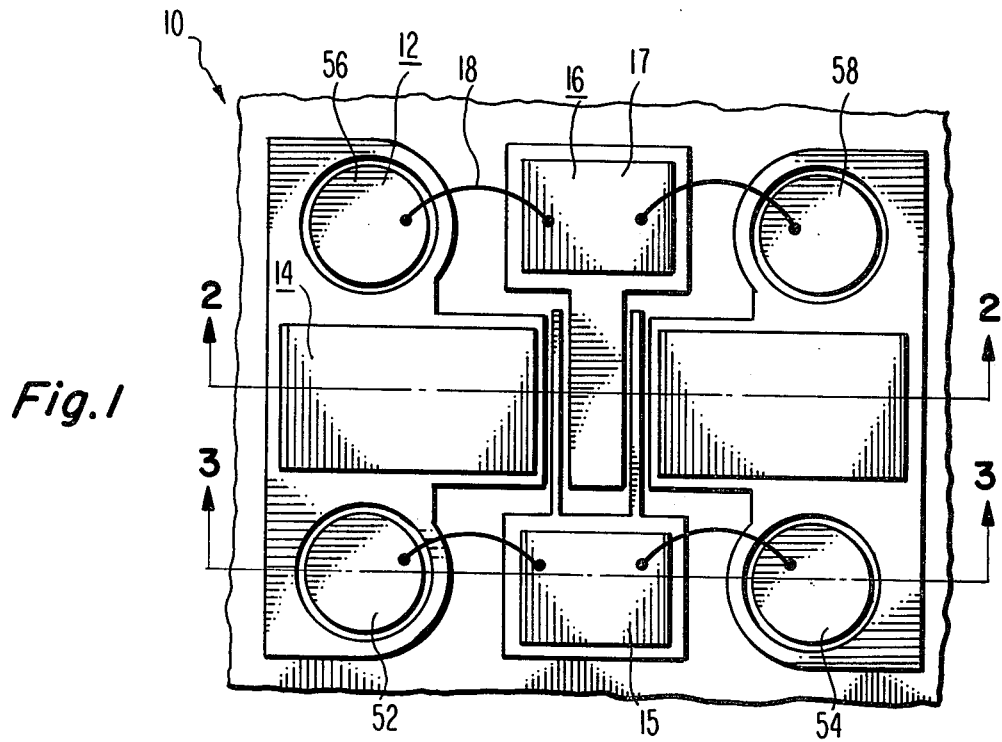
FIG. 1 is a plan view of a monolithic VCO of the present invention.

As illustrated in FIG. 1, a monolithic VCO device 10 of the present invention comprises four varactor diodes 12, a multiple gate FET 14, a pair of thin film capacitors 16, and interconnecting means 18 between the diodes 12 and FET 14. It should be recognized that the device 10 of FIG. 1 represents an exemplary embodiment of the present invention and that the invention is not limited to this particular geometry. For example, any number of varactor diodes might be used, the FET 14 can include any number of gates, and the thin film capacitors 16 are components which are optional to the VCO operation.

Figure 2:
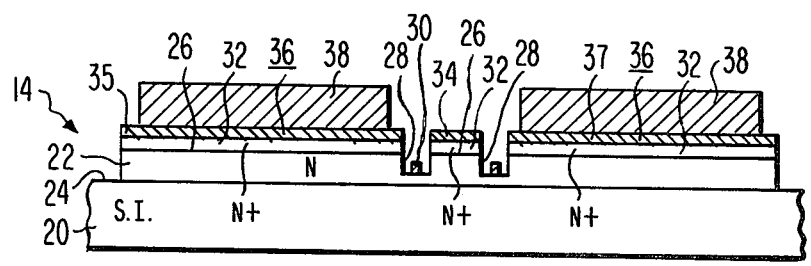
FIG. 2 is a sectional view of the VCO of FIG. 1 taken along line 2—2. It illustrates the structure of the FET portion of the device.

As the sectional view of the FET 14 in FIG. 2 illustrates, the monolithic VCO 10 is fabricated on a substantially planar semi-insulating substrate 20. The substrate 20 might comprise monocrystalline GaAs, although other materials would be satisfactory as well. For example, the substrate 20 could alternatively be high resistivity silicon (having a resistivity greater than approximately 10,000 Ω-cm) or sapphire. An active semiconductor layer 22, doped so as to be of a particular conductivity type, is disposed on a planar surface 24 of the substrate 20. The material of the active layer might be a compound semiconductor when a compound semiconductor substrate 20 is used, or it can be silicon, when a silicon or sapphire substrate 20 is used. The active layer 22 is also substantially planar, having a planar surface 26, and it can optionally include a cavity 28 or plurality of cavities 28. Within each cavity 28 is a gate electrode 30 which might, for example, form a Schottky barrier contact with the active layer 22. In the illustrated embodiment, the FET 14 incorporates two gate electrodes 30, each being disposed in a cavity 28 in the active layer 22.

A contact layer 32 is disposed across the active layer surface 26, the contact layer being of similar conductivity type as the active layer 22 but of higher conductivity. Ohmically disposed on the contact layer 32 are source and drain electrodes, designated 34 and 36 respectively. The source and drain electrodes are located, generally, such that a gate electrode is disposed between each source electrode/drain electrode pair. In the preferred embodiment, comprising a two gate FET, a single source electrode 34 is disposed between the two gate electrodes 30, and two drain electrodes 36 are disposed on either side of the gate/source/gate electrode structure so as to create in seriatim first drain/first gate/source/second gate/second drain electrodes. Hereinafter, the first and second drain electrodes will be identified 35 and 37 respectively. Additionally, in the preferred embodiment a bonding post 38 extends from each of the drain electrodes 36 so as to provide a means for bonding the VCO 10 directly to an associated circuit.

The source, gate and drain electrodes of the FET 14 are substantially rectangular in shape and the gate electrodes 30 preferably have relatively long, narrow profiles so as to yield a relatively short channel length and a relatively long channel width. The described FET 14 operates as a depletion type device, wherein a current flow in the active region 22 between the source electrode 34 and each of the drain electrodes 36 can be pinched off by appropriately biasing the gate electrodes 30. The magnitude of the gate voltage required to pinch-off a particular source to drain current is determined by the depth of the cavities 28, a parameter which is determined during device fabrication.

In the preferred embodiment of the device 10, the active layer 22 has a carrier concentration of approximately $1 \times 10^{17}$ cm$^{-3}$ and the contact layer 32 has a carrier concentration of approximately $2 \times 10^{18}$ cm$^{-3}$. The active layer thickness might be approximately 0.5–2 microns and in the gate region it might be approximately 0.1–0.5 microns. The ohmic contact drain electrodes 36 might comprise an AuGe/Au/Ni metallization of approximately 2500 Angstroms thickness, and the bonding posts 38 might be Au, approximately 3 to 5 microns thick. The described structure can be fabricated by conventional processing techniques and the details of the suggested process will follow the description of the varactor portion of the device 10.

Figure 3:
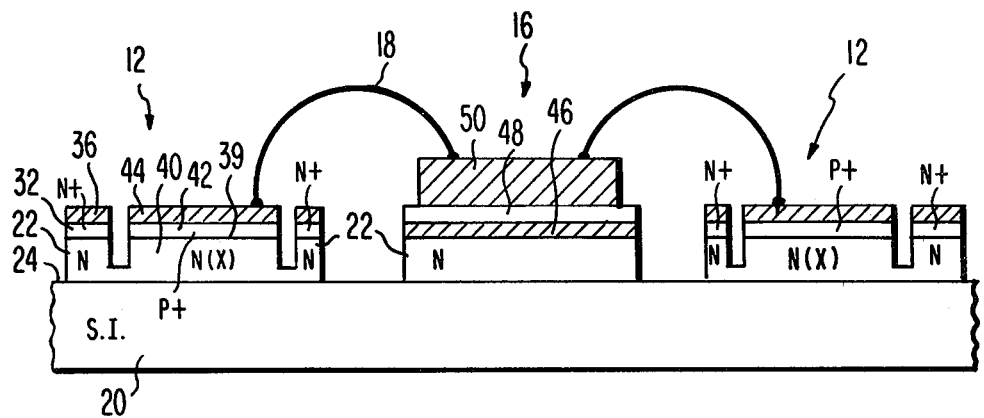
FIG. 3 is a sectional view of the VCO of FIG. 1 taken along line 3—3. It illustrates the varactor diode portion as well as a thin film capacitor which has been incorporated on the same semiconductor body.

Two of the four varactor diodes 12 and one of the two thin film capacitors 16 are illustrated in the sectional view of FIG. 3. The other two varactors and capacitor can be of similar structure. In the preferred embodiment the varactor diodes 12 each incorporate a hyperabrupt PN junction 39, although alternative embodiments, incorporating a Schottky barrier junction or junctions which are non-hyperabrupt, are possible as well. Each hyperabrupt varactor diode 12 comprises an active diode portion 40 on the surface 24 of the substrate 20, the active diode portion 40 being contiguous with the previously described active layer 22. The conductivity of the active diode portion 40 is designated N(x) because the carrier concentration therein varies as a function of distance from the junction 39. In the preferred embodiment, the carrier concentration at the junction 39 should be approximately $5 \times 10^{16}$ cm$^{-3}$, and it decreases to approximately $4 \times 10^{15}$ cm$^{-3}$ at a distance of approximately 2 microns.

The hyperabrupt junction 39 is formed between the active diode portion 40 and a relatively high conductivity opposite conductivity type layer 42 disposed thereon. This high conductivity layer 42 is designated P+ and has a carrier concentration of approximately $1 \times 10^{19}$ cm$^{-3}$. An anode electrode 44 is disposed in ohmic contact with the P+ layer 42 and might comprise, for example, gold/zinc metallization. As illustrated in the drawing, the varactors of the present invention are substantially cylindrical in shape and are surrounded by and contiguous with the active layer 22. That portion of the active layer 22 surrounding each varactor 12 is continuous with the active layer 22 which underlies the drain electrodes 36 of the FET 14. That portion of the active layer 22 surrounding each varactor 12 additionally includes a contact layer 32 and metallization 36 overlying the contact layer. Thus, the metallization 36 serves as a cathode to the varactor 12 in addition to serving as the drain electrode for the FET 14.

Also illustrated in FIG. 3 is a representative thin film capacitor 16. The capacitor 16 comprises a first electrode 46 in the form of a metal layer, an insulation layer 48 overlying the first electrode 46, and a second electrode 50 overlying the insulation layer 48. For convenience, the first electrode 46 is disposed on a portion of the active layer 22 isolated from the FET 14 and varactors 12, although alternatively, it could be disposed directly on the surface 24 of the semi-insulating substrate 20. The first electrode 46 might comprise, for example, 2500 Angstroms of AuGe/Au/Ni metallization, the insulation layer 48 might comprise a 2000 Angstrom thick oxide, and the second electrode 50 might comprise 1-3 microns of Au. In the preferred embodiment two thin film capacitors are utilized, one on the gate side of the FET 14, hereinafter referred to as the first thin film capacitor 15, and one on the source side of the FET 14, hereinafter referred to as the second thin film capacitor 17.

Interconnection means 18 interconnect the second electrode 50 of each thin film capacitor 16 with the anode electrode 44 of an appropriate varactor diode 12. These interconnections might comprise, for example, bonded wires or other conventional crossovers or air bridges. In the preferred embodiment there are four varactor diodes 12, so four bonded wires are used. A first varactor 52 is between the first drain electrode 35 and the first thin film capacitor 15, a second varactor 54 is between the second drain electrode 37 and the first thin film capacitor 15, a third varactor 56 is between the first drain electrode 35 and second thin film capacitor 17, and a fourth varactor 58 is between the second drain electrode 37 and second thin film capacitor 17. In this embodiment, the first and second varactors, 52 and 54 are used for frequency control, and the third and fourth varactors, 56 and 58 are used for impedance matching.

As previously indicated, the described VCO 10 can be fabricated utilizing conventional processing techniques. Initially, a semi-insulating substrate can be provided and an active N type compound semiconductor epitaxial layer can be grown on a surface thereof. Alternatively, an active N type silicon layer can be formed on a silicon or sapphire substrate. The N type active layer can then be subjected to selective ion implantation so as to define the N+ contact layers 32 and 34, the N(x) active diode portion 40, and the high conductivity P+ layer 42. Following the ion implantations the implanted portions should be annealed by thermal or laser means.

The ohmic contact metallization which will ultimately define the drain electrodes 36, the anode electrode 44, and the first electrode 46 of the thin film capacitors can then be formed by conventional vapor deposition techniques such as evaporation or sputtering. Using standard photolithographic techniques, the metallization layers 36, 44, and 46; the contact layers 32; the high conductivity P+ layer 42; and the active layer 22, are then selectively etched so as to yield the individual varactors 12, the FET 14, and the thin film capacitors 16.

The pair of Schottky barrier gate electrodes 30 are then formed in the appropriate locations on the active layer 22 and are connected with the first electrode 46 of the first thin film capacitor 15. In the preferred embodiment, the first electrode 46 of the second thin film capacitor 17 is continuous with the metallization of the source electrode 34 of the FET 14.

Figure 4:
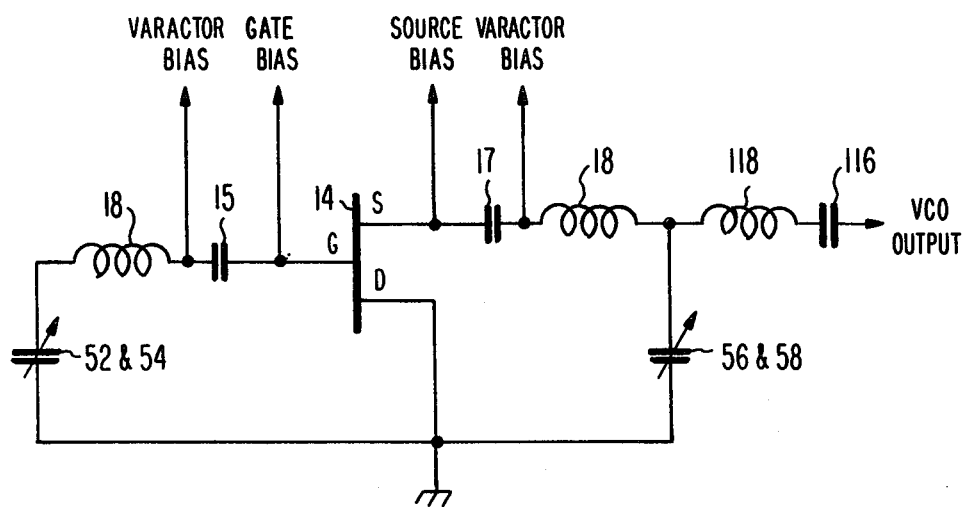
FIG. 4 is a schematic representation of the monolithic VCO of the present invention.

A schematic representation of the monolithic VCO 10, and appropriate associated external circuitry is illustrated in FIG. 4. The first thin film capacitor 15, and the first and second hyperabrupt varactors 52 and 54 are series connected between the gate and drain of the FET 14. Similarly, the second thin film capacitor 17 is series connected with the third and fourth hyperabrupt varactors 56 and 58, between the source and drain of the FET 14. Between each of the thin film capacitors 16 and varactors 12, the interconnection means 18 are represented as inductors. To simplify the schematic drawing, varactors 52 and 54 are represented by a single symbol, and varactors 56 and 58 are represented by a single symbol. Similarly, the interconnection means between each of these pairs of varactors and its associated thin film capacitor is represented by a single inductor symbol 18.

External inputs to the VCO are located on either side of each of the thin film capacitors 15 and 17. More specifically, the gate bias can be applied to the first electrode 46 of capacitor 15, and the bias for varactors 52 and 54 can be applied to the second electrode 50 of capacitor 15. The source bias can be applied to the first electrode of capacitor 17, and the bias for varactors 56 and 58 can be applied to the second electrode of capacitor 17.

The VCO output can be obtained between the thin film capacitor 17 and the varactors 56 and 58 on the source side of the FET 14. This can be achieved, for example, by wire bonds to the anode electrodes 44 of the third and fourth varactors 56 and 58, and can further include a series connected capacitor. These additional wire bonds and series connected capacitor are designated 118 and 116 respectively in FIG. 4. Lastly, the drain electrodes of the FET 14 should be RF and DC grounded. This can be accomplished, for example, by conventionally flip chip bonding the drain electrode bond posts 38 of the VCO 10 to a suitable electrical ground.

The described VCO structure might have a total gate width of approximately 150 microns and a gate length of approximately 0.75 microns. The hyperabrupt varactor on the gate side of the FET might have a 10:1 capacitance ratio, and the dimensions of the substrate surface 24 might be approximately 0.3 mm by 0.3 mm. Compared with conventional VCOs the VCO of the present invention is physically small. This allows relatively short interconnections 18 between the various components and results in reduced parasitic impedances. These low parasitic impedances, coupled with the relatively high capacitance ratio, provide a wide tuning range, which in the described device might be approximately 7 to 18 GHz. The actual VCO frequency is determined by a resonant circuit comprising the FET gate-drain capacitance, the capacitance of varactors 52 and 54, and the inductance provided by the interconnections 18 on the gate side of the FET. On the source side of the FET 14, a low pass filter, comprising the varactors 56 and 58, and the interconnections 18 to the second thin film capacitor 17, provides wide band matching, although other impedance matching arrangements could be employed as well.

The present invention thus provides a monolithic VCO design incorporating four hyperabrupt varactors, an FET incorporating two gates, and a pair of thin film capacitors. It should be recognized, however, that the invention is not so limited, and that other embodiments incorporating a varactor diode and an FET on a single substrate are also within the scope of the invention.

What is claimed is:

1. A monolithic voltage controlled oscillator device, comprising:
    a substrate having an active semiconductor region disposed thereon;
    said active semiconductor region having source, gate and drain electrodes spaced thereon so as to form an FET;
    first and second varactor diodes disposed in said active semiconductor region, said diodes being contiguous with the FET drain electrode;
    a first thin film capacitior having first and second electrodes, said first electrode being contiguous with said FET gate electrode;
    a second thin film capacitor having first and second electrodes, said first electrode being contiguous with said FET source electrode; and
    interconnection means between said first diode and said second electrode of said first capacitor and between said second diode and said second electrode of said second capacitor, such that relatively few noncontiguous interconnection means are utilized.

2. A device in accordance with claim 1, wherein each varactor diode incorporates a hyperabrupt PN junction.

3. A device in accordance with claim 1, wherein the substrate comprises a semi-insulating material; and the active semiconductor region comprises a doped compound semiconductor layer.

4. A device in accordance with claim 1, wherein the active semiconductor region comprises a doped silicon layer; and the substrate comprises a material selected from the group consisting of high resistivity silicon and sapphire.

5. A device in accordance with claim 1, wherein the FET further comprises second gate and second drain electrodes disposed in seriatim with said drain, gate and source electrodes on the active semiconductor region.

6. A device in accordance with claim 5, further comprising:
    a third varactor diode contiguous with the second drain electrode and interconnected to the first thin film capacitor; and
    a fourth varactor diode contiguous with the second drain electrode and interconnected to the second thin film capacitor.

7. A device in accordance with claim 1, wherein the interconnection means between the varactor diode and thin film capacitor comprises wire.

8. A device in accordance with wtih claim 1, wherein the interconnection means between the varactor diode and thin film capacitor comprises an air bridge.

9. A device in accordance with claim 1, wherein the interconnection means between the varactor diode and thin film capacitor comprises a crossover.

* * * * *